LUMINESCENT BORON SUBPHOSPHIDE SEMICONDUCTOR DEVICE

Filed Oct. 31, 1967 2 Sheets-Sheet 1

OPTICAL TRANSMISSION OF A $B_6P$ SPECIMEN HAVING A CARBON CONTENT < 0.05 WT. %

NEAR EDGE ELECTROLUMINESCENT EMISSION SPECTRUM

INVENTORS
ROBERT A. BURMEISTER, Jr.
EGON E. LOEBNER

BY Roland I. Griffin
ATTORNEY

April 14, 1970 R. A. BURMEISTER, JR., ET AL 3,506,869

LUMINESCENT BORON SUBPHOSPHIDE SEMICONDUCTOR DEVICE

Filed Oct. 31, 1967 2 Sheets-Sheet 2

ELECTROLUMINESCENT EMISSION SPECTRUM IN THE VISIBLE

PHOTOLUMINESCENT EMISSION SPECTRUM IN THE VISIBLE

INVENTORS
ROBERT A. BURMEISTER, Jr.
EGON E. LOEBNER

BY Roland D. Griffin

ATTORNEY

United States Patent Office 3,506,869
Patented Apr. 14, 1970

3,506,869

LUMINESCENT BORON SUBPHOSPHIDE SEMICONDUCTOR DEVICE

Robert A. Burmeister, Jr., Los Altos, and Egon E. Loebner, Palo Alto, Calif., assignors to Hewlett-Packard Company, Palo Alto, Calif., a corporation of California Filed Oct. 31, 1967, Ser. No. 679,303
Int. Cl. H05b *33/14*
U.S. Cl. 313—108 4 Claims

ABSTRACT OF THE DISCLOSURE

A P-N junction in a body of $B_6P$ is forward biased to provide electroluminescent emission from an optically transparent region having an impurity content of less than 0.05 percent by weight of carbon and 0.1 percent by weight of other impurities.

BACKGROUND AND SUMMARY OF THE INVENTION

Boron subphosphide has a higher energy band gap than most presently used semiconductor materials. This property would make it useful as a semiconductor light source over a wider range of the visible portion of the spectrum than these semiconductor materials. Moreover, boron subphosphide has a high degree of thermal stability that would permit a semiconductor light source made from it to be used at temperatures in excess of 1,000° C. By comparison, semiconductor devices made from the better known germanium and silicon semiconductor materials are typically useable only up to temperatures of about 80° C. and 200° C., respectively. However, boron subphosphide has generally been available only in the form of opaque blue-black crystals. These opaque crystals are typically neither luminescent nor capable of transmitting any luminescence that may take place within them to the surrounding medium. Thus, it has not previously been practical to employ boron subphosphide to provide a luminescent semiconductor device useful for emitting light in the visible portion of the spectrum or useful at high temperatures.

Accordingly, it is a principal object of this invention to provide a luminescent boron subphosphide semiconductor device.

In accordance with the illustrated embodiment of the invention, this object is accomplished by providing a body of $B_6P$ including a region having an impurity content of less than 0.05 percent by weight of carbon and 0.1 percent by weight of other impurities. This region is optically transparent to photons having energies up to the band gap energy of the region.

DESCRIPTION OF THE PREFERRED EMBODIMENT

Figure 1:
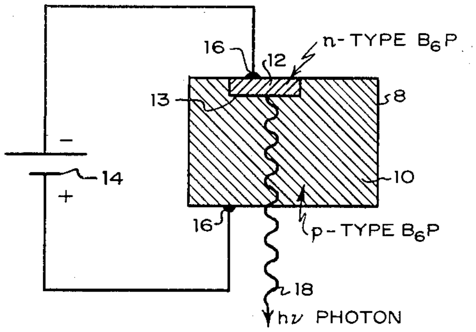
FIGURE 1 is a cross-sectional view of an electroluminescent semiconductor device embodying the invention.

Referring now to FIGURE 1, there is shown a luminescent semiconductor device comprising a body 8 of boron subphosphide having a boron-to-phosphorous atomic ratio of 6 to 1. This body 8 includes a region 10 of, for example, P-conductivity type. The region 10 has an impurity content of less than 0.05 percent by weight of carbon and 0.1 percent by weight of other impurities. It is therefore optically transparent to photons having energies up to the band gap energy of the region. Optical absorption data indicate that the energy band gap of $B_6P$ is approximately 3.3 electron volts at room temperature. The energy band gap of $B_6P$ decreases with increasing temperature in much the same manner as it does in other semiconductors.

Figure 2:
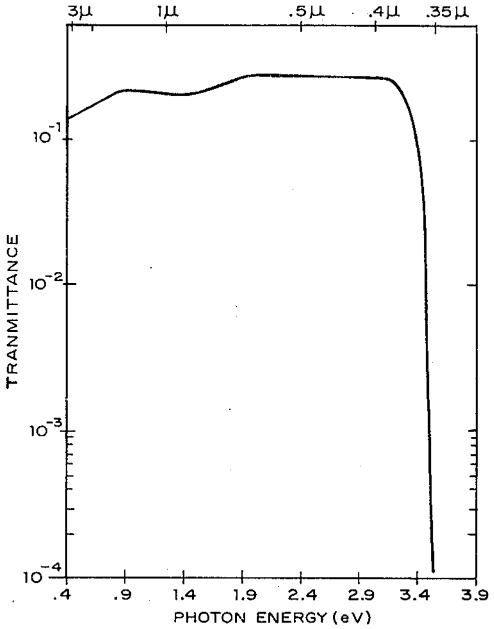
FIGURE 2 is a plot of transmittance versus photon energy showing the optical transmission characteristic at room temperature of a $B_6P$ material according to one embodiment of this invention.

As shown in FIGURE 2, the region 10 has a relatively flat optical transmission characteristic that begins to fall off sharply at the band gap energy. In $B_6P$ specimens having a carbon content in excess of 0.05 weight percent, the transmittance is so low that in practice these specimens are not opticaly transparent and hence are not luminescent.

Figure 3:
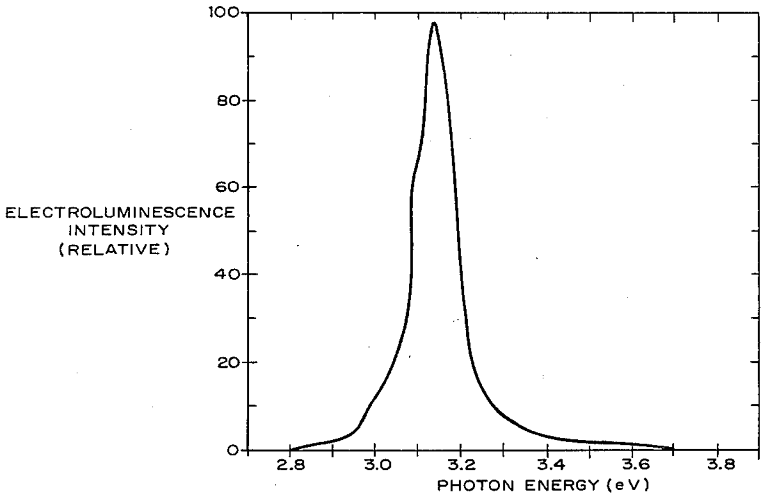
FIGURE 3 is a plot of relative electroluminescence intensity versus photon energy showing the near edge electroluminescent emission spectrum at room temperature of a $B_6P$ material according to one embodiment of this invention.
Figure 4:
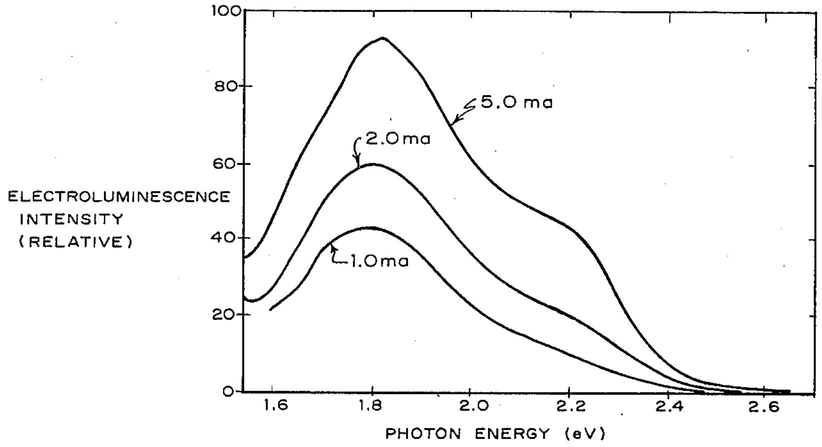
FIGURE 4 is a plot of relative electroluminescence intensity versus photon energy showing the electroluminescent emission spectrum in the visible at room temperature of a $B_6P$ material according to one embodiment of this invention for different injection currents.

Since the region 10 is optically transparent to photons having energies up to its band gap energy, the body 8 may be usefully employed for electroluminescence, photoluminescence, cathodoluminescence, or thermoluminescence. For example, the body 8 may be used for electroluminescence by including therein a region 12 of N-conductivity type to form a P-N junction 13 with the region 10. A source 14 of bias potential may be connected by pressure or alloy contacts 16 to the P- and N-regions 10 and 12 for forward biasing the P-N junction 13. This produces electroluminescent emission of photons from the optically transparent region 10 as indicated at 18. The electroluminescent emission may comprise ultraviolet and/or orange or yellow-orange visible light as shown in FIGURES 3 and 4.

Figure 5:
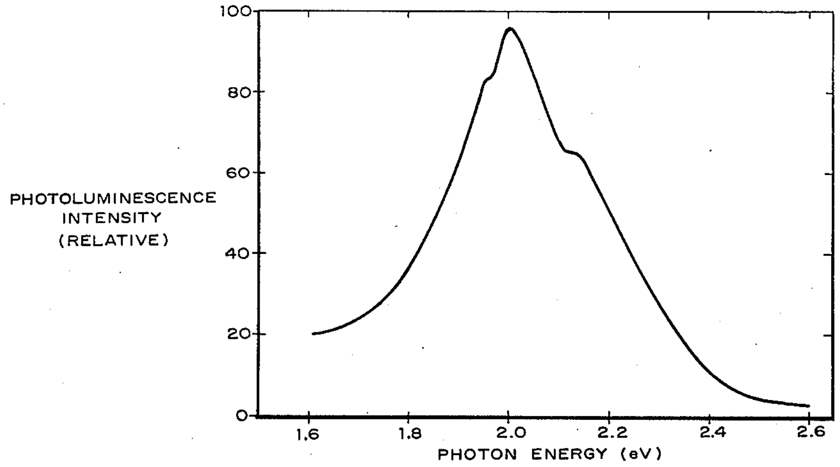
FIGURE 5 is a plot of relative photoluminscence intensity versus photon energy showing the photoluminescent emission spectrum in the visible at room temperature of a $B_6P$ material according to one embodiment of this invention.

Photoluminescence may be observed by irradiating the region 10 with ultraviolet light. A typical photoluminescent emission spectrum in the visible is shown in FIGURE 5. The overall color apparent to the eye is yellow to yellow-orange. Similarly, cathodluminescence may be observed by applying an electron beam having an accelerating potential of 35 kilovolts, a beam current of 25 microamperes, and a current density of about $8 \times 10^{-2}$ amperes per square centimenter to the region 10. By so doing violet, blue, green, yellow and orange colors may be observed.

Crystalline $B_6P$ having an impurity content of less than 0.05 percent by weight of carbon and 0.1 percent by weight of other impurities may be formed by heating a substrate crystal in a very pure vapor atmosphere of phosphine and boron tribromide or boron trichloride reactants. An N-conductivity type $B_6P$ crystal may be formed during the reaction initiated in this step. This crystal may be doped P-conductivity type by thermal decomposition of a silicon or carbon containing compound gas. These steps and apparatus for performing them are described in detail in Robert A. Burmeister's copending patent application Ser. No. 662,175 entitled Method and Means to Produce Light Emitting Boron Subphosphide Semiconductor Devices, and filed on Aug 21, 1967.

What is claimed is:

1. A body of semiconductor material comprising boron subphosphide having a boron-to-phosphorous atomic ratio of 6 to 1, said boron subphosphide having an impurity content of less than 0.05 percent by weight of carbon and 0.1 percent by weight of other impurities and being substantially optically transparent to photons having energies up to its band gap energy.

2. A body as in claim 1 wherein said boron subphosphide is capable of at least one of electroluminescence, photoluminescence, thermoluminescence, and cathodoluminescence.

3. An electroluminescent semiconductor body as in claim 2 wherein said boron subphosphide includes:

a first region of P-conductivity type; and a second region of N-conductivity type forming a P-N junction with said first region to make said device capable of producing electroluminescent emission from said first region.

4. An electroluminescent semiconductor body as in claim 3 including means for forward biasing said P-N junction to provide electroluminescence from said first region.

References Cited

UNITED STATES PATENTS

| | | | |
|---|---|---|---|
| 3,147,412 | 9/1964 | Hill | 317—237 |
| 3,395,986 | 8/1968 | Gruber | 317—235 X |

FOREIGN PATENTS

| | | |
|---|---|---|
| 6401716 | 8/1964 | Netherlands. |

RAYMOND F. HOSSFELD, Primary Examiner

U.S. Cl. X.R.

148—33, 189; 252—62.3, 301.4; 317—235